(12) United States Patent
Ernst et al.

(10) Patent No.: US 7,705,438 B2
(45) Date of Patent: Apr. 27, 2010

(54) ELECTRONIC COMPONENT AND LEADFRAME FOR PRODUCING THE COMPONENT

(75) Inventors: Georg Ernst, Thalmassing (DE); Horst Groeninger, Maxhütte-Haidhof (DE); Simon Jerebic, Regensburg (DE); Thomas Zeiler, Regensburg (DE)

(73) Assignee: Infineon Technologies, AG, Neubiberg (DE)

( * ) Notice: Subject to any disclaimer, the term of this patent is extended or adjusted under 35 U.S.C. 154(b) by 926 days.

(21) Appl. No.: 11/332,470

(22) Filed: Jan. 17, 2006

(65) Prior Publication Data

US 2006/0151879 A1    Jul. 13, 2006

Related U.S. Application Data

(63) Continuation of application No. PCT/DE2004/001150, filed on Jun. 4, 2004.

(30) Foreign Application Priority Data

Jul. 14, 2003    (DE) ................ 103 32 017

(51) Int. Cl.
*H01L 23/495* (2006.01)
*H01L 23/48* (2006.01)
*H01L 23/52* (2006.01)
*H01L 29/40* (2006.01)

(52) U.S. Cl. .................... 257/677; 257/673; 257/738

(58) Field of Classification Search ......... 257/737–738, 257/666–677, E23.035
See application file for complete search history.

(56) References Cited

U.S. PATENT DOCUMENTS

| 5,663,593 | A | 9/1997 | Mostafazadeh et al. |
| 5,710,695 | A | 1/1998 | Manteghi |
| 5,804,880 | A * | 9/1998 | Mathew ................. 257/779 |
| 5,914,536 | A | 6/1999 | Shizuki et al. |
| 6,034,423 | A * | 3/2000 | Mostafazadeh et al. ..... 257/691 |
| 6,229,200 | B1 | 5/2001 | Mclellan et al. |
| 6,391,758 | B1 | 5/2002 | Lo et al. |
| 6,501,160 | B1 | 12/2002 | Higuchi et al. |
| 6,577,012 | B1 | 6/2003 | Greenwood et al. |
| 2003/0042593 | A1 | 3/2003 | Gilbert |
| 2003/0057550 | A1 * | 3/2003 | Zhao et al. .............. 257/734 |

FOREIGN PATENT DOCUMENTS

| DE | 100 38 120 A1 | 10/2001 |
| JP | 05304235 A2 | 11/1993 |

\* cited by examiner

*Primary Examiner*—Cuong Q Nguyen
(74) *Attorney, Agent, or Firm*—Edell, Shapiro & Finnan, LLC

(57) ABSTRACT

An electronic component includes a semiconductor chip and a leadframe. The leadframe includes a metal coating pattern on its underside to facilitate the application of solder to the electronic component. The metal coating pattern includes wetting regions that are wettable with solder material and anti-wetting regions that are unwettable with solder material, and the electronic component includes solder deposits formed on the wetting regions on the underside of the component.

8 Claims, 5 Drawing Sheets

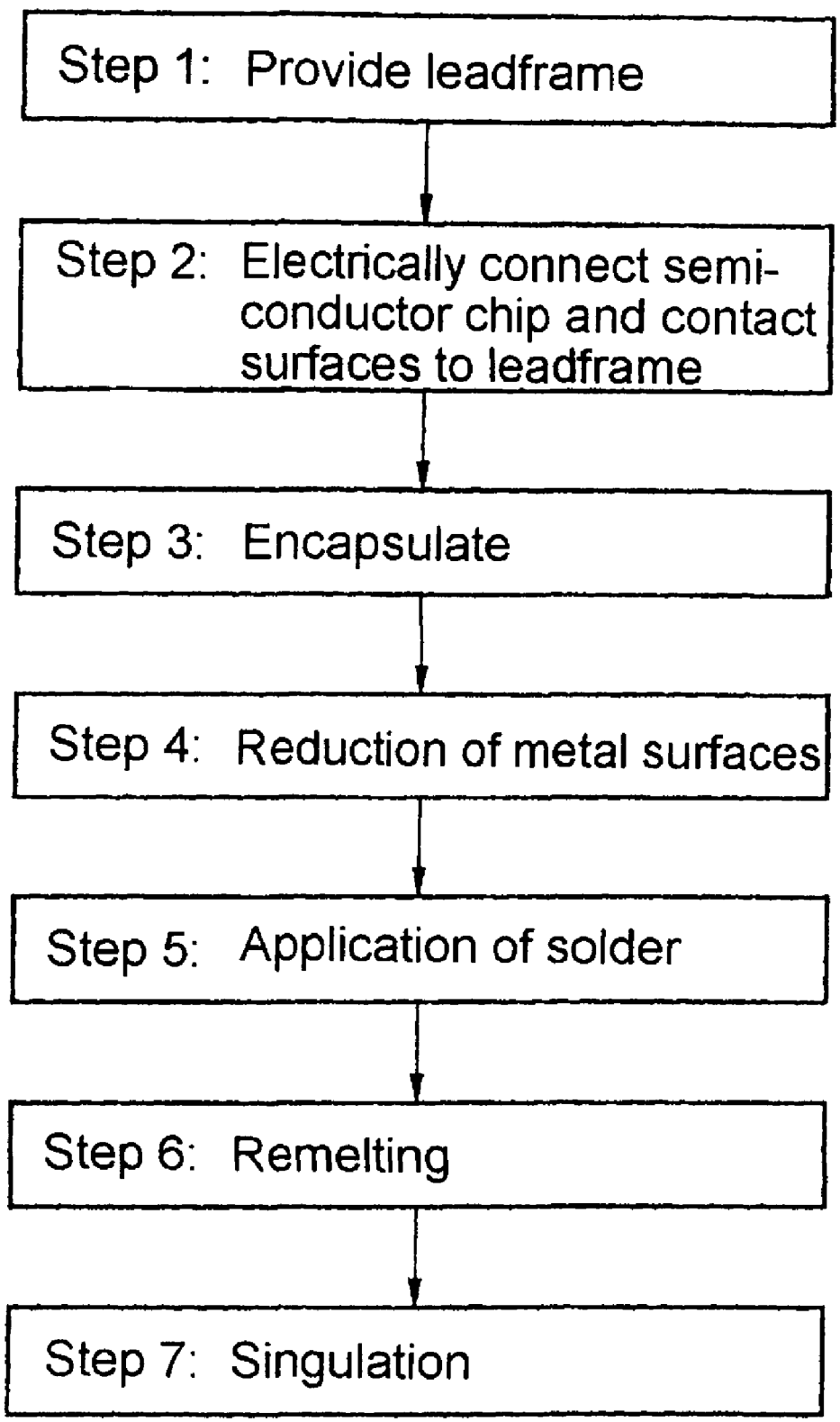

ELECTRONIC COMPONENT AND LEADFRAME FOR PRODUCING THE COMPONENT

CROSS REFERENCE TO RELATED APPLICATIONS

This application is a continuation of International Application No. PCT/DE2004/001150, filed on Jun. 4, 2004, and titled "Electronic Component and Leadframe for Producing the Component," and further claims priority under 35 USC §119 to German Application No. DE 103 32 017.2, filed on Jul. 14, 2003, and titled "Electronic Component and Leadframe for Producing the Component," the entire contents of which are hereby incorporated by reference.

FIELD OF THE INVENTION

The invention relates to an electronic component with semiconductor chip and outer contact surfaces on the underside of the electronic component for surface mounting of the electronic component on a higher-level electrical circuit of a circuit carrier. The invention also relates to a leadframe for producing an electronic component of this type and to a production method.

BACKGROUND

To simplify surface mounting, electronic components with outer contact surfaces on the underside are individually provided with fluxes or with solder coatings on the outer contact surfaces. An application of solder of this nature is intended to effect electrical connection to the higher-level electronic circuit. Application of solder to individual components is complex and results in solder deposits of different heights on the outer contact surfaces for different outer surface sizes, which is detrimental to reliable mounting and reliable electrical connection to the higher-level electronic circuit.

SUMMARY

It is an object of the invention to provide an electronic component which has an improved application of solder to the outer contacts on the underside.

Another object of the invention is to provide a method for producing such a component which allows mass production of the components at low cost.

The aforesaid objects are achieved individually and in combination, and it is not intended that the present invention be construed as requiring two or more of the objects to be combined unless expressly required by the claims attached hereto.

In accordance with the present invention, an electronic component is provided comprising a semiconductor chip. The back surface of the semiconductor chip is arranged on a chip island, and the semiconductor chip includes contact surfaces on its active top side. The chip island is surrounded by flat conductors that are electrically connected to the contact surfaces on the top side of the semiconductor chip. The semiconductor chip, the electrical connections and the top sides of the flat conductors and of the chip island are embedded in an encapsulation compound. The undersides of the flat conductors and of the chip island are covered with solder deposits that are surrounded by anti-wetting regions of a metal layer that is unwettable by solder material.

A component of this type has the advantage that the anti-wetting regions can be arranged on the undersides of the flat conductors and of the chip island in such a manner that surfaces of wetting regions which are of the same size and same shape are surrounded by the anti-wetting regions. It is therefore possible to restrict the solder material to surfaces which are of the same shape and approximately the same size on the undersides of flat conductors and chip island, and to provide regions with a metal coating that are not wetted by solder material or flux or by a soldering stop resist for the machining involved in the production of an electronic component of this type. As a result, the dividing tools which, for example, cut through the flat conductors, in order to stamp electronic components out of a larger assembly, remain sharp for a longer time, since they are not exposed to soft metals, such as solder material, or to organic substances, such as fluxes or soldering stop resists, during the production process.

A further advantage of the electronic component resides in the approximately uniform size of the solder deposits, which makes it possible to achieve an approximately constant height of the solder deposits and therefore facilitates surface mounting of the electronic component and ensures a reliable connection to a higher-level circuit.

The anti-wetting regions that have been produced by metal coating and patterning and surround the solder deposits comprise nickel or a nickel alloy or an iron-chromium-nickel alloy. The metal of the anti-wetting regions therefore acts as an organic soldering stop resist. Materials of this type ensure that the solder material does not wet a coating of this type. The advantageous result of this is that solder deposits are only formed where the undersides of the flat conductors and of the chip island are devoid of a non-wettable coating of this type.

To facilitate the application of a solder deposit in the other regions during the application of solder, it is possible for wetting regions of this type to be coated with gold or a gold alloy. For this purpose, a coating that is wettable by solder material is arranged in the wetting regions between solder deposit and undersides of flat conductors and chip island.

Since a chip island usually includes a larger surface area than outer contacts made from flat conductor material, the chip island may comprise a plurality of solder deposits which are separated by anti-wetting regions and the surface area of which corresponds to the solder deposits on the smaller flat conductors. This at the same time prevents an excessively high solder deposit from forming on the larger surface of the chip island. To meter a quantity of solder which is as uniform as possible onto each of the wetting surfaces, it is advantageous to use solder deposits which are remelted from solder balls to solder bumps in the wetting regions. Solder balls of this type are produced with a low tolerance and can therefore produce a uniform shape and height of the solder deposits.

In accordance with another embodiment of the invention, a suitable leadframe is provided to produce a plurality of electronic components. The leadframe includes component positions arranged in rows and columns. A central chip island for the application of semiconductor chips is arranged in each of the component positions. The chip island is surrounded by flat conductors, the top sides of which include contact connection surfaces. The contact connection surfaces on the top sides of the flat conductors include a bondable coating, for example of a silver alloy. A metal coating pattern, which comprises anti-wetting regions formed from a metal that is unwettable by solder material and wetting regions formed from a metal that is wettable by solder material, is applied to the undersides of the flat conductors and of the chip island. The wetting regions are surrounded by the anti-wetting regions.

With the aid of this type of pattern comprising wettable and non-wettable metals, the underside of the flat conductors and of the chip islands can be prepared in such a manner that surfaces of entirely the same size are available for the application of solder deposits. The anti-wetting regions on the leadframe include the same metal composition as the finished electronic component. It is preferable for the metal coating pattern to comprise nickel or a nickel alloy or a stainless steel alloy for the antiwetting regions. The wetting regions themselves, surrounded by the anti-wetting regions, may comprise gold or a gold alloy. Copper and copper alloys can also be wetted by the solder material if fluxes are added. In any event, the surrounding anti-wetting regions ensure that the flat conductors and the chip islands include regions that are not wetted by solder material.

A method for producing a leadframe in accordance with the present invention and with a plurality of component positions comprises the following method steps. First, a metal strip is provided. Then, the metal strip is patterned to form component positions that are arranged in rows and columns, a component position including a central chip island that is surrounded by flat conductors. Then, a metal coating that is not wetted by solder material can be applied to the underside of the patterned metal strip. Next, this metal coating is patterned to form anti-wetting regions in such a manner that surfaces which are wettable by solder material are left clear as wetting regions for solder deposits.

This type of patterning of metal coatings can be carried out by dry-etching techniques or wet-etching techniques. On the other hand, it is possible to apply a patterned metal coating from the outset, by the underside of the leadframe being covered through a stencil with a metal layer that is unwettable by solder material.

A leadframe prepared or provided in this way has the advantage that the application of solder to the underside of the leadframe and therefore the application of solder in the individual component positions can be carried out simultaneously for a large number of components. Moreover, with this leadframe, it is possible to provide virtually uniformly shaped solder deposits on the underside of the individual components, so that during subsequent surface mounting of the components a reliable connection to the higher-level circuit is possible. Finally, this leadframe ensures that dividing tools which stamp or cut the components out of the leadframe in the individual component positions do not lose their sharpness through contact with solder material or organic material, with the result that the stamping times of these tools are not adversely affected by the application of solder to the leadframe.

A method for producing an electronic component using a leadframe of this type comprises the following additional method steps. Semiconductor chips, which on their active top sides include contact surfaces and the back surfaces of which are fixed to the chip island, are mounted on the chip islands of the leadframe in each of the component positions. Then, electrical connections between the contact surfaces of the semiconductor chips and contact connection surfaces on the flat conductors of the leadframe are produced, for example by bonding wires. Finally, the semiconductor chips, the electrical connections and the top sides of the flat conductors and of the chip islands are embedded in a plastic encapsulation compound, leaving clear the underside of the leadframe.

Then, solder deposits are applied to the wetting regions, which are wettable with solder material, of the underside of the leadframe. After the solder material in the solder deposits has been remelted, the leadframe is divided into individual electronic components. The division into electronic components takes place in anti-wetting regions of the leadframe, which are devoid of solder material and include a metal coating that is unwettable by solder material. The application of the solder deposits to the wetting regions of the underside of the leadframe in each of the component positions can be carried out using techniques that are suitable for mass production, such as the wave-soldering bath techniques, spray-on techniques or the application of solder balls in the respective wetting regions.

During the remelting of the applied solder material, the latter effects wetting only in the wetting regions and not in the anti-wetting regions covered by a corresponding metal coating. In particular, the method of the invention takes advantage of the property of different metal surfaces which on the one hand are wettable by a solder material and on the other hand are unwettable by a solder material. Non-wettable metals comprise nickel and nickel compounds as well as iron-chromium-nickel alloys, whereas the wettable metals may comprise gold and gold alloys, silver or silver alloys and copper and copper alloys.

Thus, the methods of the present invention facilitate inexpensive production of components to which solder has been applied, such as for example VQFN components, on existing production lines. With the leadframe of the invention, it is also possible to use the stamping processes to singulate components. This has not hitherto been possible with conventional solder application technology, since insufficient contact between the flat conductors and the cutting die has previously led to process problems due to the application of solder and the stamping of soft metals.

The accurate application of a solder stop metal to the leadframe underside, taking into account boundary conditions for standard stamping processes, facilitates division of even leadframes to which solder has been applied into individual components by an inexpensive stamping process. Available standard processes, such as stencil printing, ball attach or solder jet techniques can be used for the application of solder itself. An efficient and inexpensive application of solder to a leadframe, which has been correspondingly prepared on its underside, can also be effected by a wave-soldering bath technique.

By using suitably adapted cutting tools, it is possible to stamp out the components to which the application of solder has been completed without difficulty. By applying an anti-wetting coating, it is possible to prevent uncontrolled running and inaccurate positioning of the solder deposits on the underside of the leadframe. Positioning and dimensioning of the solder deposit is maintained to an accuracy of approx. $\pm 10\,\mu m$ for the subsequent stamping singulation. This enables the cutting die to be reliably positioned next to the solder deposits on the undersides of the flat conductors.

Thus, electronic components and leadframes formed according to the invention provide a number of advantages including, without limitation, the following:

1. Stamping singulation can be used despite the application of solder.
2. The coating of the leadframes can be carried out in the as-delivered state of leadframes.
3. Inexpensive component production is possible since standard processes can be used.
4. Defined anti-wetting regions with what are known as soldering stop openings are feasible even on the chip islands on account of the invention, with the result that it is possible to distribute solder deposits for improved surface mounting on higher-level circuits.

5. Large-area flat conductors can continue to be used as before for a high level of reliability.
6. The anti-wetting regions provide a temperature-resistant and stampable layer that does not adversely affect the service life of the stamping tools.
7. Standard solder pastes that can be applied to the underside of the leadframe at low cost by stencil printing can be used for the application of solder.

The above and still further objects, features and advantages of the present invention will become apparent upon consideration of the following detailed description of specific embodiments thereof, wherein like numerals designate like components.

BRIEF DESCRIPTION OF THE DRAWINGS

FIG. 7 provides method steps involved in the production of an electronic component in accordance with an embodiment of the invention.

DETAILED DESCRIPTION

Figure 1:
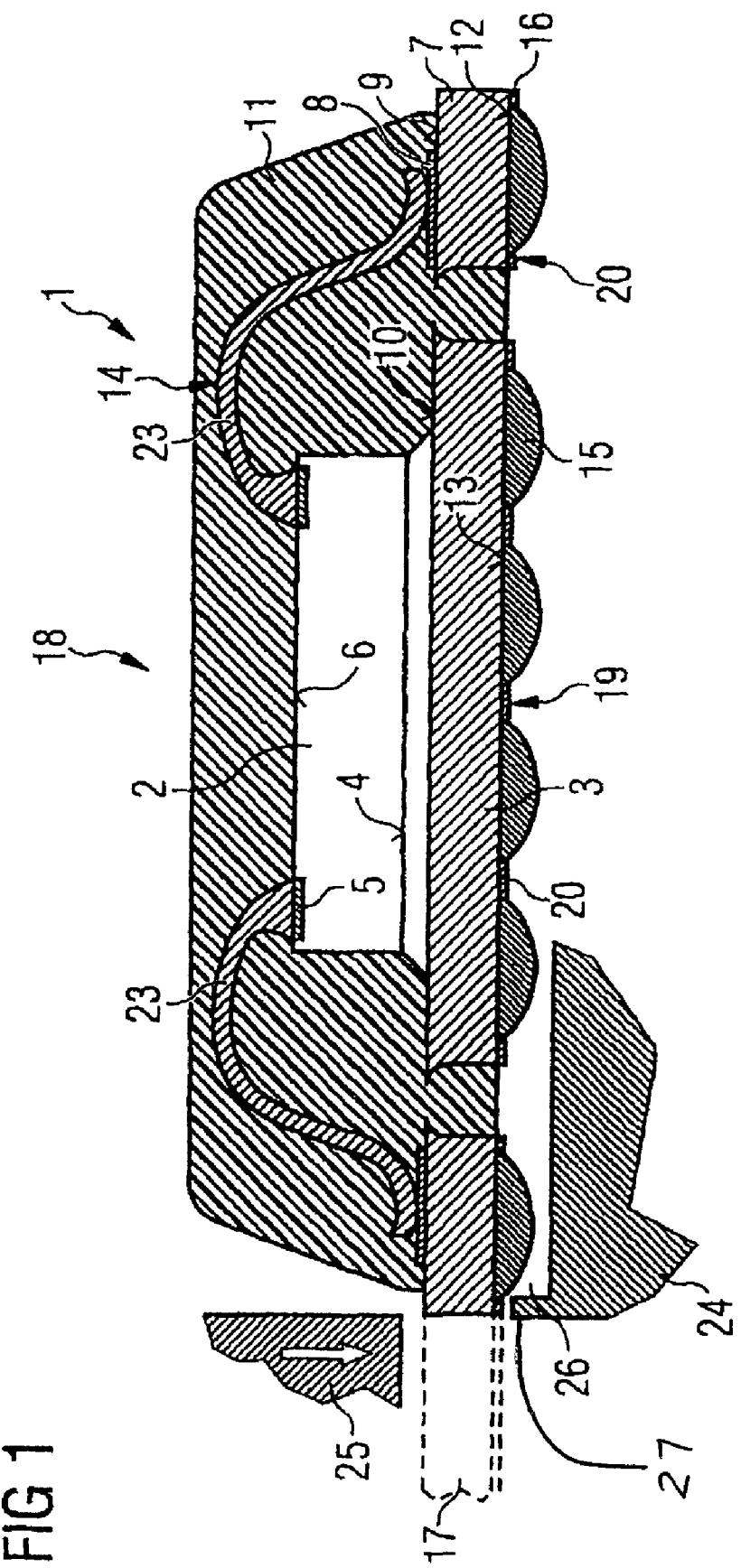
FIG. 1 depicts a diagrammatic dross section through an electronic component in accordance with a first embodiment of the invention.

FIG. 1 shows a diagrammatic cross section through an electronic component 1 of a first embodiment of the invention. The electronic component 1 includes a semiconductor chip 2, the back surface 4 of which is fixed to a chip island 3. An active top side 6 of the semiconductor chip 2 includes contact surfaces 5. While the chip island 3 with the semiconductor chip 2 is arranged in the center of the electronic component, flat conductors 7, which surround the chip island 3, are arranged on the underside at the edges of the electronic component 1.

Coatings which improve the bondability of the top side 9 of the flat conductors 7 have been applied as contact connection surfaces 8 to the top sides 9 of the flat conductors 7. Bonding wires 23 lead from the contact surfaces 5 of the semiconductor chip 2 to the contact connection surfaces 8 of the flat conductors 7. The bonding wires 23 therefore produce an electrical connection 14 between the semiconductor chip 2 and the flat conductors 7. The flat conductors 7 and the chip island 3 form the underside of the electronic component 1, while the top sides 9 and 10 of the flat conductors and of the chip island, as well as the semiconductor chip 2 and the bonding wires 23, are embedded in a plastic encapsulation compound 11.

The undersides 12 and 13 of the flat conductors 7 and of the chip island 3 include solder deposits 15 that are arranged on the wettable material of a leadframe 17. This material of the leadframe 17, which is wettable by a solder material of the solder deposits 15, comprises a copper alloy. In addition, a metal coating pattern 19, which forms a metallic soldering stop structure with its anti-wetting regions 20, has been applied to the undersides 12 and 13 of chip islands and flat conductors. The anti-wetting regions 20 comprise a metal that is unwettable by solder material, such as nickel or a nickel alloy, and are patterned in such a manner that they surround each of the solder deposits 15.

The metal coating pattern 19 of the anti-wetting regions 20 also provides solder deposits 15 of the same shape and size which are accurately defined on the underside 13 of the chip island 3. Moreover, the anti-wetting regions 20 are patterned in such a manner that stamping tools 24 and 25 for separating out the component 1 out of the leadframe 17 in a component position 18 do not come into contact with the solder deposits. For this purpose, the stamping table 24 includes a recess 26 which ensures a distance with respect to the solder deposits 15. Furthermore, the stamping table includes a stamping edge 27 that projects beyond the recess 26, so that no solder material of the solder deposits 15 is touched by the stamping blade 25. Rather, the stamping tools 24 and 25 operate exclusively in anti-wetting regions 20, which comprise a metal layer 16 that is unwettable by solder material and also the metallic material of the flat conductors 7.

Figure 2:
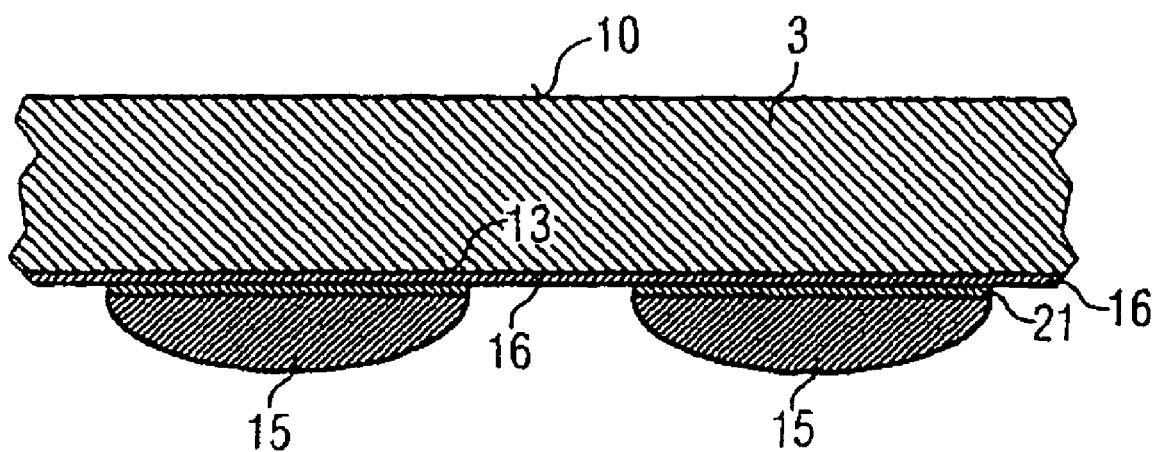
FIG. 2 depicts a diagrammatic cross section through a chip island of the electronic component in accordance with a second embodiment of the invention.

A diagrammatic cross section through a chip island 3 of the electronic component is depicted in FIG. 2 in accordance with a second embodiment of the invention. In this embodiment of the invention, the chip island 3 is covered on its underside 13 by a continuous metal layer 16 which is unwettable by solder material. Individual patterned wetting regions 21 formed from a metal such as gold or a gold alloy have been applied to this continuous non-wettable layer 16, allowing solder deposits 15 to be formed thereon.

Figure 3:
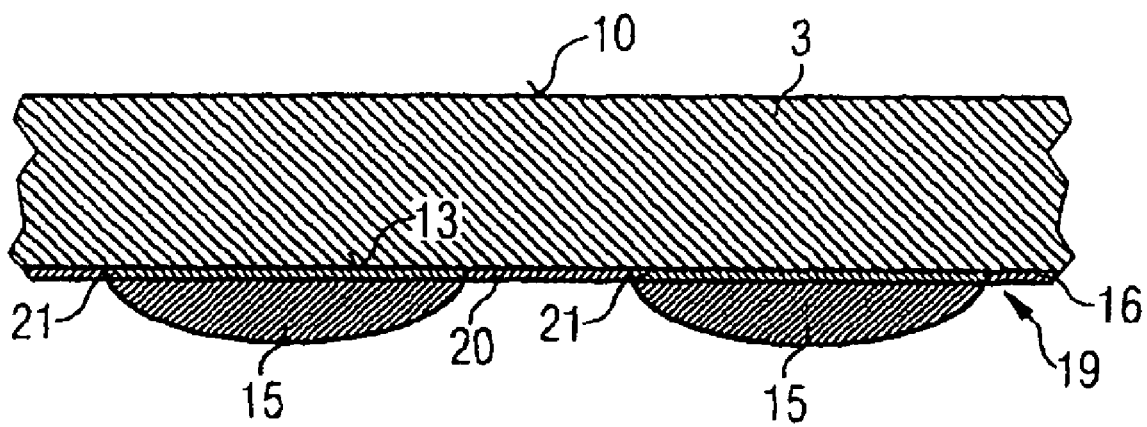
FIG. 3 depicts a diagrammatic cross section through a chip island of the electronic component in accordance with a third embodiment of the invention.

A diagrammatic cross section through a chip island 3 of the electronic component is shown in FIG. 3 in accordance with a third embodiment of the invention. In this embodiment of the invention, solder deposits 15, which have been applied to wetting regions 21, are arranged on the underside 13 of the chip island 3, while the wetting regions 21 are surrounded by a metal coating pattern 19 that comprises a non-wettable metal layer 16 of a nickel alloy. Therefore, wetting regions 21 and anti-wetting regions 20 alternate on the underside 13 of the chip island 3 and ensure that solder deposits 15 which are of the same shape and approximately the same size are formed on the underside 13 of the chip island 3.

Figure 4:
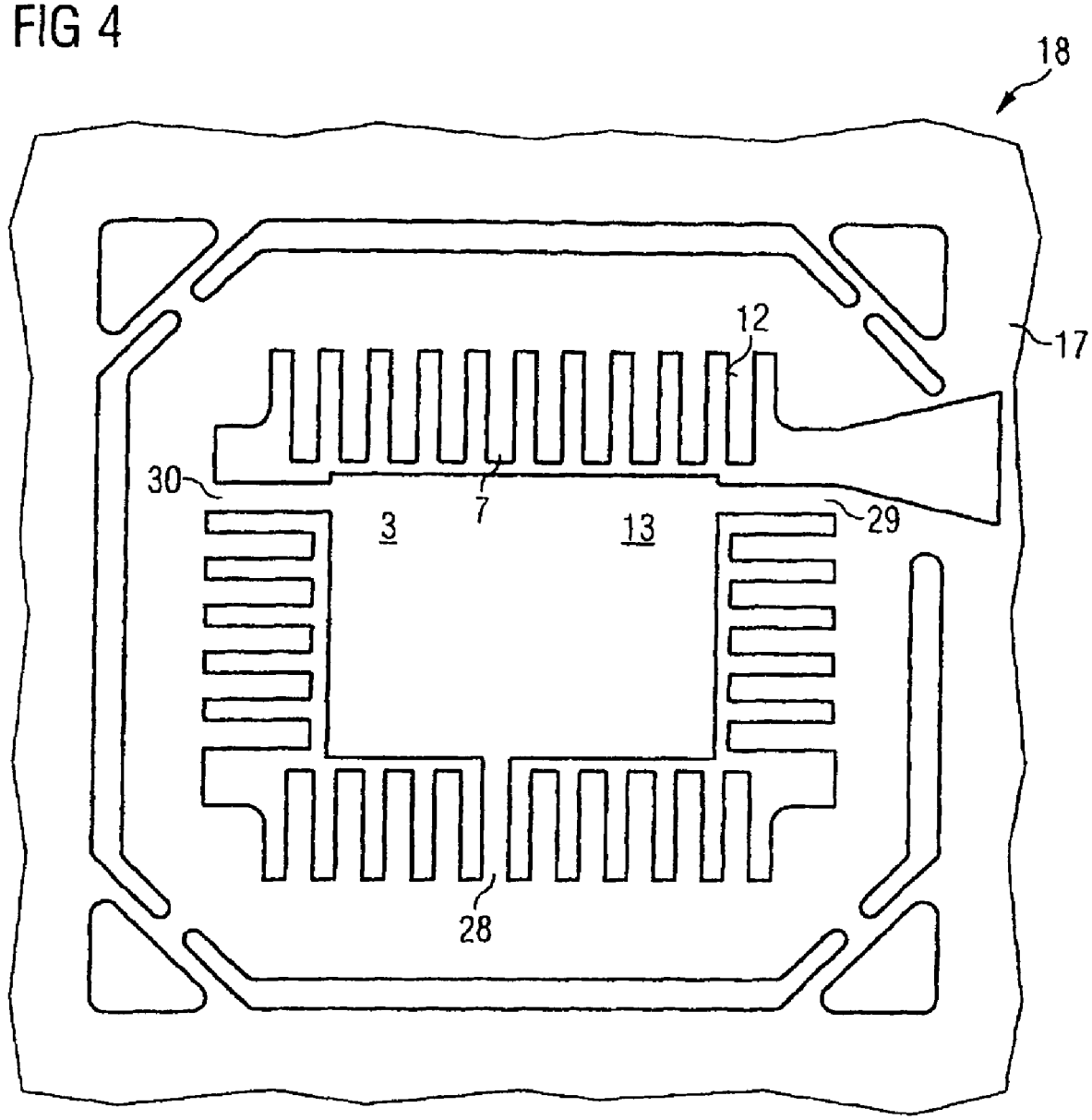
FIG. 4 depicts a diagrammatic plan view from below onto a component position of a flat conductor prior to the application of a metal coating pattern.

In FIG. 4, a diagrammatic plan view is shown from below onto a component position 18 of a leadframe 17 prior to application of a metal coating pattern. In its center, the component position 18 includes a chip island 3 that is held by flat conductors 28, 29 and 30 of the leadframe 17. The chip island 3 is surrounded by flat conductors 7. The other openings in the leadframe 17 are used to make the structure resilient to relatively high pressures when it is being encapsulated by a plastic encapsulation compound.

Figure 5:
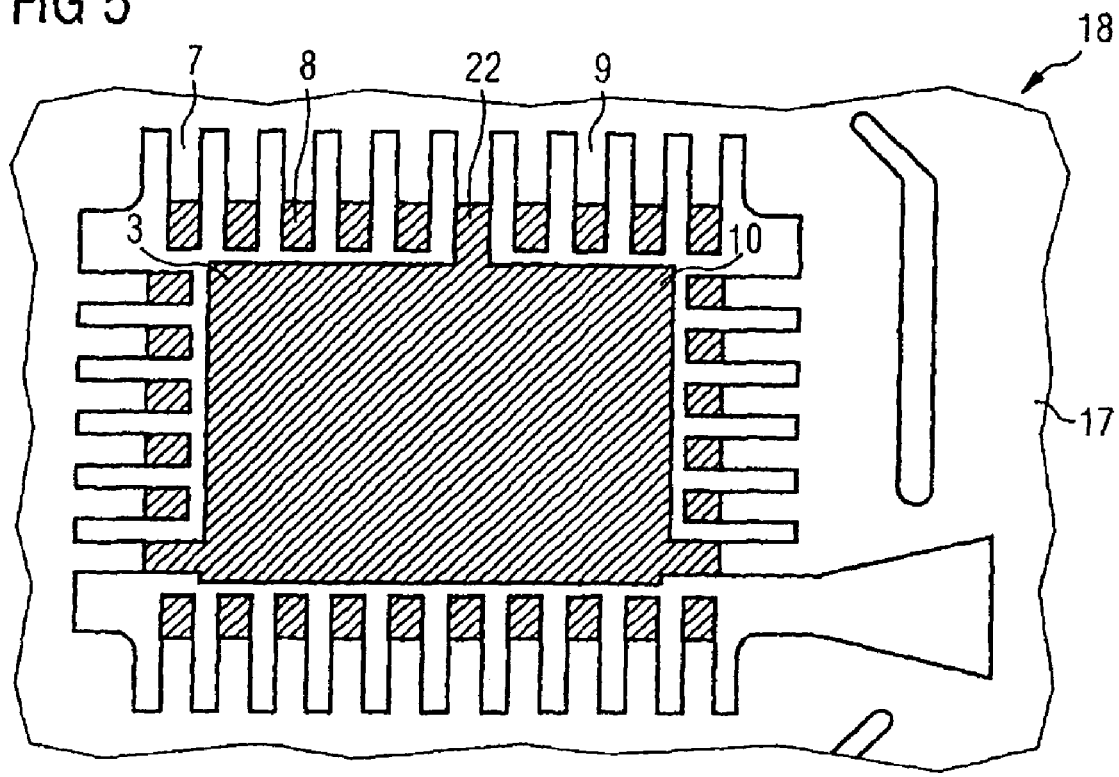
FIG. 5 depicts a diagrammatic plan view onto the component position shown in FIG. 4 after application of a coating to the top side of the leadframe.

In FIG. 5, a diagrammatic plan view is shown onto the component position 18 of FIG. 4 after application of a coating 22 to the top side of the leadframe. The surfaces which are covered by the coating 22 on the top side of the leadframe 17 are hatched and enclose the top side 10 of the chip island 3 and subregions of the top sides 9 of the flat conductors 7. In the embodiment shown in FIG. 5, this coating 22 is a gold alloy which allows eutectic soldering of the silicon semiconductor chip onto the chip island 3 and forms bondable contact connection surfaces 8, onto which bonding wires are bonded, on the flat conductors 7.

Figure 6:
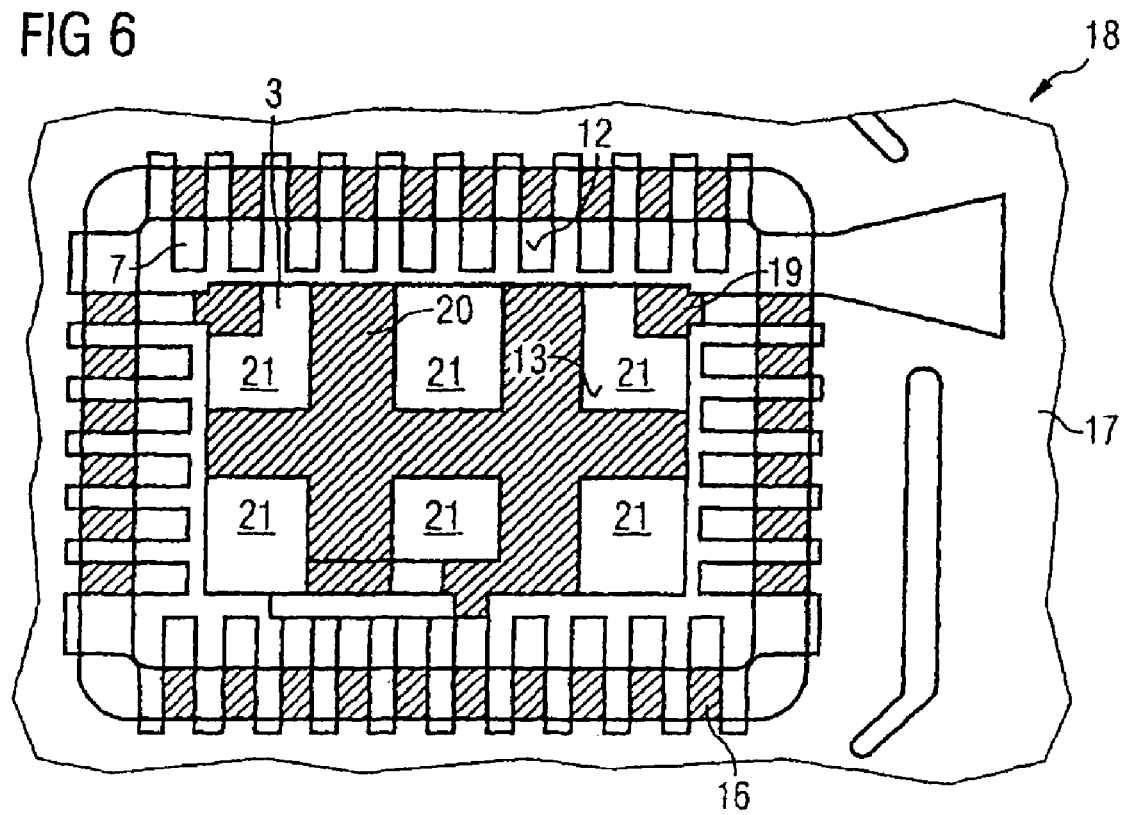
FIG. 6 depicts a diagrammatic plan view from below onto the component position in accordance with FIG. 4 and FIG. 5 after application of a metal coating pattern to the underside of the leadframe.

In FIG. 6, a diagrammatic view from below is shown onto the component positions 18 in accordance with FIG. 4 after application of a metal coating pattern 19 to the underside of the leadframe 17. This metal coating pattern 19 comprises a nickel alloy, which has been applied in a thickness of between 1 µm and 2 µm to the underside of the leadframe 17 in each component position 18 and has been patterned in such a manner as to form wetting regions 21 which are surrounded by anti-wetting regions 20 comprising the non-wettable metal layer 16 of a nickel alloy. Furthermore, the regions of the flat conductors 7 which are stamped out of the leadframe 17 during division of the leadframe 17 into individual components have likewise been coated with a metal layer 16 that is unwettable by solder material. In FIG. 6, the regions covered by a metal layer 16 that is unwettable by solder material are indicated by simple hatching.

In FIG. 7, method steps are set forth showing the production of an electronic component in accordance with the invention. In step 1, a leadframe for a plurality of electronic components is plated with a soldering stop metal in the as-delivered state and is delivered in patterned form, so that wetting regions and anti-wetting regions alternate on the underside of the leadframe. In the next method step 2, a semiconductor chip is fixed on this as-delivered leadframe which has already been provided with a soldering stop metal layer, for which purpose the leadframe has a chip island, and after the semiconductor chip has been fixed to the chip island, it is also possible for the application of bonding wires to be performed in step 2, connecting contact surfaces on the active top side of the semiconductor chip to contact connection surfaces on the flat conductors of the leadframe.

The next step 3 involves encapsulation with a plastic encapsulation compound. In this step, the semiconductor chip, the bonding wires of the bonding connection and the top sides of the leadframe, i.e. the top sides of the flat conductors and the top side of the chip island, are embedded in a plastics material. After removal of the leadframe in step 4 with applied plastic encapsulation compounds, the metal surfaces on the underside of the leadframe are reduced in order to remove metal oxides, which may have formed during the injection-molding process, from the metal surfaces.

This is followed in step 5 by the application of solder, during which the wetting regions of the metal coating pattern are provided with solder deposits by stencil printing or application of solder balls or are provided with a stock of solder by a wave-soldering bath technique. In the next step 6, this stock of solder is remelted in such a manner that only the wetting regions of the underside of the leadframe are covered with solder deposits, while the anti-wetting regions act as a solder stop resist and are not wetted with solder material at all. Then, as the final method step 7, the electronic components are singulated, in which step stamping tools carry out a stamping operation only in anti-wetting regions of the leadframe.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed:

1. An electronic component comprising:
a chip island including a top side and an underside that opposes the top side;
a semiconductor chip including contact surfaces disposed on an active top side of the semiconductor chip and a back surface that opposes the active top side and is arranged on the top side of the chip island;
flat conductors arranged to surround the chip island, the flat conductors including top sides and undersides opposing the top sides, the top sides of the flat conductors including contact connection surfaces; and
electrical connections extending between the contact surfaces of the semiconductor chip and the contact connection surfaces of the flat conductors;
wherein the semiconductor chip, the electrical connections and the top sides of the flat conductors and of the chip island are embedded in a plastic encapsulation compound, and the undersides of the flat conductors and of the chip island include solder deposits and anti-wetting regions of a metal layer that surround the solder deposits and the metal layer is unwettable by solder material.

2. The electronic component of claim 1, wherein the anti-wetting regions comprise one of nickel, a nickel alloy and an iron-chromium-nickel alloy.

3. The electronic component of claim 1, wherein the solder deposits are formed at wetting regions, each wetting region comprising a coating that is wettable by solder material and is disposed between a solder deposit and a corresponding underside of a flat conductor or the chip island.

4. The electronic component of claim 1, wherein the solder deposits are distributed in a matrix that is uniform along the undersides of the flat conductors and the chip island.

5. The electronic component of claim 1, wherein the solder deposits are formed from solder balls that have been remelted to form solder bumps.

6. A leadframe for producing a plurality of electronic components, the leadframe comprising:
component positions arranged in rows and columns;
a plurality of chip islands being arranged in the component positions; and
a plurality of semiconductor chips, each semiconductor chip being disposed on a corresponding chip island;
wherein each chip island is surrounded by flat conductors, the flat conductors including top sides with contact connection surfaces that have a bondable coating, each of the chip islands and the flat conductors includes an underside with a metal coating pattern that comprises anti-wetting regions formed from a metal that is unwettable by solder material and wetting regions formed from a metal that is wettable by solder material, the wetting regions being surrounded by the anti-wetting regions.

7. The leadframe of claim 6, wherein the anti-wetting regions of the metal coating pattern comprise one of nickel, a nickel alloy and a stainless steel alloy.

8. The leadframe of claim 7, wherein the wetting regions of the metal coating pattern comprise one of gold and a gold alloy.

* * * * *